United States Patent [19]
Portmann

[11] Patent Number: 5,119,347
[45] Date of Patent: Jun. 2, 1992

[54] METHOD AND TIMING DEVICE FOR MEASURING TIME INTERVALS

[75] Inventor: Urs Portmann, Villars-sur-Glâne, Switzerland

[73] Assignee: Saia AG, Murten, Switzerland

[21] Appl. No.: 602,650

[22] Filed: Oct. 24, 1990

[30] Foreign Application Priority Data

Oct. 31, 1989 [EP] European Pat. Off. ......... 89810816

[51] Int. Cl.$^5$ .............................................. G04F 8/00
[52] U.S. Cl. .................................... 368/113; 368/118
[58] Field of Search ................................ 368/113–121

[56] References Cited

U.S. PATENT DOCUMENTS

| 4,440,503 | 4/1984 | Arichi et al. | 368/107 |
| 4,841,497 | 6/1989 | Bateman et al. | 368/113 |

FOREIGN PATENT DOCUMENTS

| 2903555 | 8/1979 | Fed. Rep. of Germany . |
| 57-199327 | 12/1982 | Japan . |
| 61-218218 | 9/1986 | Japan . |
| 63-157519 | 6/1988 | Japan . |
| 2159646 | 6/1983 | United Kingdom . |

OTHER PUBLICATIONS

Article to Larson "Cascading Timers Extend Delay Periods" 2119 E.D.N. (Electrical Design News) 29 1984 Aug., No. 17, Boston, Mass. U.S.A.

Primary Examiner—Vit W. Miska
Attorney, Agent, or Firm—Marks Murase & White

[57] ABSTRACT

By means of a potentiometer an analog voltage Ua is applied to an A/D converter. A reference voltage Uref is also applied to the A/D converter and the same produces a digital output information corresponding to the ratio between the analog voltage and the reference voltage. This digital output information of the A/D converter is periodically counted by a preselection counter and this counter delivers an output pulse whenever it has counted the value stored in the A/D converter. The potentiometer, A/D converter and counter form a time base of which the time unit depends on the position of the potentiometer only and not on fluctuations of the operating voltage. Due to the continuous periodic sampling and storing of the digital output information of the A/D converter, high accuracy of the time basis is obtained since a statistic mean value of the digital value is repeatedly counted.

5 Claims, 1 Drawing Sheet

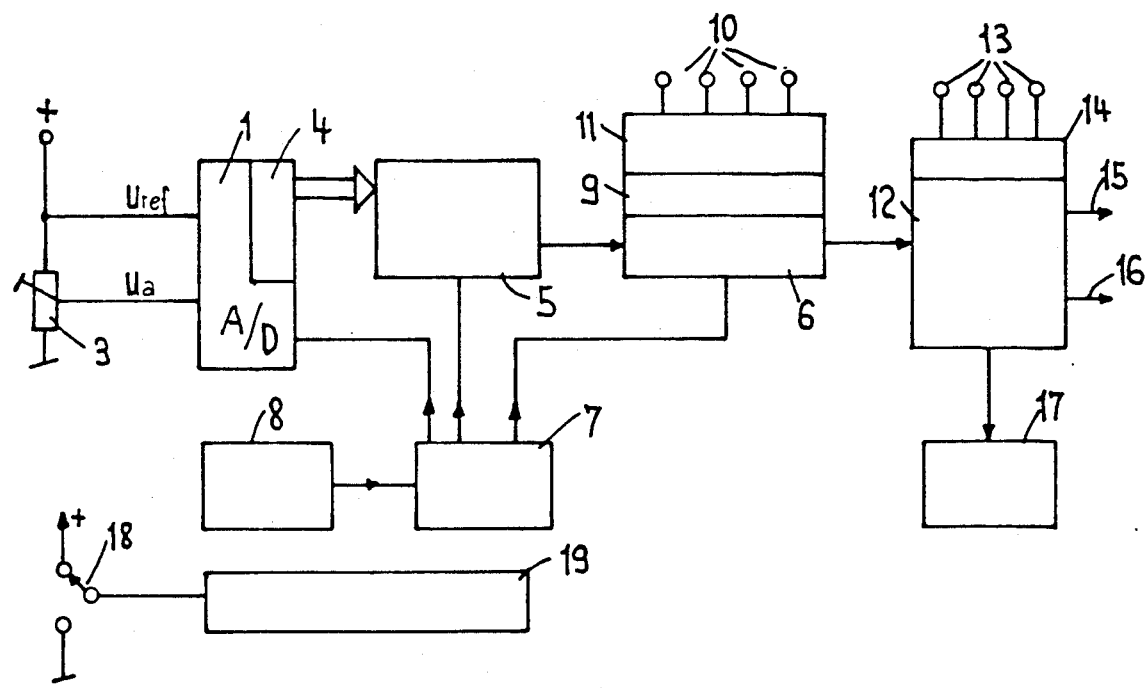

5,119,347

METHOD AND TIMING DEVICE FOR MEASURING TIME INTERVALS

BACKGROUND OF THE INVENTION

This invention relates to a method and a timing device, wherein the time interval to be measured is determined by counting a preselected number of periods of a time basis, for instance of a RC-oscillator or voltage-controlled oscillator. All these prior timing devices have limited accuracy and stability. Particularly the time measurement depends on the operating voltage of the time basis. Devices of this kind need a relatively high number of separate elements such as condensers and resistors so that they cannot be integrated to a substantial degree.

In order to overcome said difficulties resulting from instabilities of the operating voltage, it has been suggested to provide a time basis comprising a potentiometer connected to a reference voltage source, the reference voltage and the voltage at the cursor of the potentiometer being fed to input terminals of an A/D converter and this converter delivering a digital output value corresponding to the ratio between said reference voltage and the voltage at the cursor of the potentiometer (GB-A-2 159 646). This ratio and digital value respectively is used as a time basis. It is highly independent from the operating voltage because the dividing ratio of the potentiometer does not depend on the operating voltage. However, the prior device disclosed by GB-A-2 159 646 has a microcomputer controlling the timing circuits, this rendering difficult an easy integration of the device. Further, the voltage dividing ratio and corresponding digital value respectively are detected once and memorized for further time counting. However, this results in low stability and accuracy of the time measurement. Experience shows that low cost microprocessors in an industrial environment have to be protected against electromagnetic distubances at all inputs by additional components, i.e. resistors and/or capacities, which will increase the size and the costs of a timing device considerably.

SUMMARY OF THE INVENTION

It is an object of this invention to overcome the drawbacks of the above prior timing device, that is, to improve the accuracy and conditions for integration of the timing device. In order to improve said limited accuracy the timing device according to the present invention comprises a potentiometer connected to a reference voltage source, an A/D converter having a first input terminal connected to said reference voltage source and a second input terminal connected to the cursor of said potentiometer for applying a time settiing value to said A/D converter, means in said A/D converter for forming a digital value of the ratio between said reference value and said time setting value, a memory and means for periodically transfering said digital value from said A/D converter into said memory whereby said digital value is continuously sampled and memorized, a clock source and a first counter associated to said memory for counting said memorized digital value at the frequency of said clock source and transmitting an output signal whenever said first counter has reached a count corresponding to said digital value, and at least a second counter having an input receiving said output signal and means for setting said second counter, output means of said second counter delivering output signals at time intervals determined by the position of said potentiometer and the setting of said second counter. Due to the continuous periodic sampling and memorizing of said digital value, the time counting is based on a mean digital value and any systematic deviation due to an accidental initial inacuracy of the A/D conversion is avoided.

In order to avoid the use of a microprocessor and to thereby improve the conditions for integration of the timing circuits, the timing device of this invention comprises a potentiometer connected to a reference voltage source, an A/D converter having a first input terminal connected to said reference voltage source and a second input terminal connected to the cursor of said potentiometer for applying a time setting value to said A/D converter, means in said A/D converter for forming a digital value of the ratio between said reference value and said time setting value, a clock source and a first counter associated to said A/D converter for counting said digital value at the frequency of said clock source and transmitting an output signal whenever said first counter has reached a count corresponding to said digital value, and at least a second counter having an input receiving said output signal and means for setting said second counter, output means of said second counter delivering output signals at time intervals determined by the position of said potentiometer and of the setting of said second counter, said clock source having a first output connected to said A/D converter for controlling the same, and a second output connected to said first counter for counting at a counting frequency. In this way the microcomputer is replaced by clock control of the A/D converter and of the counter whereby integration is substantially facilitated.

This invention will now be explained with reference to the accompanying drawing showing by way of example an embodiment of the timing device.

BRIEF DESCRIPTION OF THE DRAWING

The drawing shows a block diagram of the embodiment of this invention.

DESCRIPTION OF THE PREFERRED EMBODIMENT

The illustrated timing device comprises an A/D converter 1 having a first analog input connected to the cursor of potentiometer 3. Potentiometer 3 and a second input of A/D converter are connected to a voltage source (+) Uref. Potentimeter 3 serves for adjusting an analog voltage Ua which determines the measurement of time in a manner explained below, this voltage Ua being adjustable between a minimum value and a maximum value. The A/D converter continuously produces a digital value corresponding to the ratio between the analog voltage Ua and the reference voltage Uref. This digital value is stored in a memory 4 of A/D converter 1. The timing device comprises a first preselection counter 5 which uses the digital value of the A/D converter directly as the preselection value and transmits an output pulse at every zero passage of counting to a second counter 6. Control inputs of the A/D converter 1 of the counter 5 and of the counter 6 are connected to suitable outputs of a frequency divider 7 the input of which is connected to a stable oscillator 8, for instance a quartz oscillator. With a suitable control frequency, for instance of 32 768 Hz the analog input value Ua is periodically converted into said digital value and the counting frequency of counter 5 may be 256 Hz if this counter and the memory 4 have each 8 bits. Obviously the output frequency of counter 5 depends on the counting frequency and on the contents of memory 4. If the A/D converter has a capacity of 8 bits, digital values between 1 and 256 may be produced and memorized, and if the counting frequency of counter 5 is 256 Hz, the output frequency of counter 5 will be 1 Hz for the maximum digital value of 256. From the foregoing it is seen that the time basis defined by the digital value stored in memory 4 is continuously adapted. It is known that the conversion rate of an A/D converter is not necessarily stable, particularly if the analog input voltage is between values exactly corresponding to a determined digital value. Therefore, while an accidental error may be in the order of 0.4% (one digit on 256) in the above prior device, this error is much smaller in the present device because it cannot be an accidental systematic error from a single digital value sampled on the A/D converter but a much smaller statistic error since said digital value is a mean or average value of a high number of individual values sampled by the A/D converter 1.

The second conunter 6 is connected to a memory 9 into which preselected digital values may be stored by means of suitable input means 10 and a decoder 11 schematically illustrated in the drawing. This value may be selected within a wide range, the memory 9 and the counter 6 having a capacity of 18 bits each. Whenever the counter 6 is reaching zero when counting the preselected value stored in memory 9 it transmits an output pulse to a function matrix 12 which may be adjusted for desired functions by means of inputs 13 and a decoder 14. Matrix 12 has two control outputs 15 and 16 through which at least one element, for instance a relay may be actuated. The matrix 12 has a display 17 indicating the mode of operation of the timing device (shut down, time interval being counted, delayed switching on, delayed switching off or output switched).

Usually the timing device is started up by applying the power. In order to obtain immediate starting up of the time counting without delay, the quartz oscillator 8 operates at a relatively high frequency for instance of 4,194,304 Hz ($2^{22}$), and this frequency is divided in divider 7 to the clock frequencies suitable for controlling the A/D converter and the counters 5 and 6. However, with particular operating modes the device may only be started or stoped through an external control switch 18 acting onto a control circuit 19 for control of the timing device. In this case the timing device is continuously connected to the power source.

A few particularities of the design and operation of the device will now be described. The A/D converter 1 with its memory 4 and counter 5 are so mutually interlocked that the digital output value of the converter remains stable during its transfer to counter 5.

It has been set out above, that the counting frequency in counter 5 is 256 Hz with a capacity of this counter and of memory 5 of 8 bits. The maximum digital value stored is 256 and the time for counting this maximum value is 1 s. When preselecting in counter 6 whole time intervals of 1 s, 1 min, 1 hour or up to 60 hours, the counter 5 would execute 1 output impulse for measuring 1 s, 60 output impulses for measuring 1 min, 3600 output impulses for measuring 1 hour and 216 000 output impulses for measuring 60 hours. During every interval between the output impulses said digital value to be counted may slightly differ from one output impulse interval to the next, that is, the time measured is based on a statistic mean value and not on one single stored value which may have an accidental error.

The minimum digital value stored is 12 and the time for counting this minimum value is 1/256 s = 4 ms.

When preselecting in counter 6 whole time intervals of 1 s, 1 min, 1 hour or up to 60 hours the counter 5 would execute 1 output impulse for measuring the minimum time, thus reducing the time to the minimum value of 4 ms, 240 ms, 14,6 s or up to 84 s respectively.

What I claim is:

1. A timing device comprising a potentiometer connected to a reference voltage source, an A/D converter having a first input terminal connected to said reference voltage source and a second input terminal connected to the cursor of said potentiometer for applying a time setting value to said A/D converter, means in said A/D converter for forming a digital value of the ratio between said reference value and said time setting value, means whereby said digital value is continuously sampled and memorized at a high sampling frequency, said digital value serving directly as the preselection value of a first counter which counts at a much lower frequency and transmitting an output pulse whenever said first counter has reached a count corresponding to said digital value, and at least a second counter having an input receiving said output pulse and means for setting said second counter, an output means of said second counter being operable for delivering output pulses at time intervals determined by the position of said potentiometer cursor and the setting of said second counter.

2. A timing device according to claim 1, wherein the output of said second counter is connected to a functional matrix.

3. A timing device according to claim 1, wherein said second counter is connected to an adjustable memory operable for preselecting whole time intervals to be counted by said second counter, and wherein said digital value is operable for selecting a part of said whole time interval.

4. A timing device according to claim 1, comprising a single display for displaying operating conditions according to a selected function.

5. A method for measuring a time interval, comprising applying an analog reference voltage to a potentiometer and to a first input of an A/D converter, applying the voltage at a cursor of said potentiometer to a second analog input of said A/D converter as an analog time setting value, obtaining a digital value of the ratio between said analog time setting voltage and said reference voltage by means of said A/D converter, periodically counting said digital value at a counting clock frequency and transmitting counting output pulses whenever a count of said digital value is reached, each count being effected for the digital value at the output of said A/D converter at the beginning of the count, counting a preselected number of said output pulses for determining said time interval, said time interval being the sum of a number of counts and digital values respectively and thereby corresponding to a mean value of a number of individual digital values.

* * * * *